(12) United States Patent
Kim et al.

(10) Patent No.: US 9,287,349 B2
(45) Date of Patent: Mar. 15, 2016

(54) SEMICONDUCTOR MEMORY DEVICES AND METHODS OF FORMING THE SAME

(71) Applicant: Samsung Electronics Co., Ltd., Suwon-Si, Gyeonggi-Do (KR)

(72) Inventors: Hyong-Soo Kim, Hwasung (KR); Byoung-Yong Gwak, Hwasung (KR); Kukhan Yoon, Hwasung (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 107 days.

(21) Appl. No.: 13/688,840

(22) Filed: Nov. 29, 2012

(65) Prior Publication Data
US 2013/0230961 A1    Sep. 5, 2013

(30) Foreign Application Priority Data
Mar. 2, 2012 (KR) .................. 10-2012-0021676

(51) Int. Cl.
*H01L 49/02* (2006.01)
*H01L 27/108* (2006.01)
*H01L 43/12* (2006.01)
*H01L 29/02* (2006.01)

(52) U.S. Cl.
CPC .......... *H01L 28/60* (2013.01); *H01L 27/10852* (2013.01); *H01L 28/91* (2013.01)

(58) Field of Classification Search
CPC ......... H01L 28/40; H01L 28/60; H01L 28/65; H01L 27/1052; H01L 29/02; H01L 29/78; H01L 29/792; H01L 29/41741; H01L 29/42336
USPC .......................................... 438/381, 238, 386
See application file for complete search history.

(56) References Cited

U.S. PATENT DOCUMENTS

| | | | |
|---|---|---|---|
| 6,482,696 B2 | 11/2002 | Park | |
| 6,822,280 B2 | 11/2004 | Ito et al. | |
| 7,202,127 B2 | 4/2007 | Busch et al. | |
| 7,288,454 B2 | 10/2007 | Lee et al. | |
| 7,459,745 B2 | 12/2008 | Lee et al. | |
| 7,666,797 B2 | 2/2010 | Shea et al. | |
| 7,700,469 B2 | 4/2010 | Benson | |
| 7,858,486 B2 | 12/2010 | Manning | |
| 7,919,863 B2 | 4/2011 | Benson | |
| 2002/0004280 A1 | 1/2002 | Park | |
| 2003/0085420 A1 | 5/2003 | Ito et al. | |

(Continued)

FOREIGN PATENT DOCUMENTS

| | | |
|---|---|---|
| JP | 4526736 B2 | 8/2010 |
| KR | 0479809 B1 | 7/2001 |

(Continued)

*Primary Examiner* — Julia Slutsker
*Assistant Examiner* — Natalia Gondarenko
(74) *Attorney, Agent, or Firm* — Harness, Dickey & Pierce, P.L.C.

(57) ABSTRACT

According to example embodiments of inventive concepts, method of forming a semiconductor memory devices includes sequentially forming a first mold layer, a first support layer, a second mold layer, and a second support layer on a substrate, forming lower electrodes penetrating the second support layer, the second mold layer, the first support layer, and the first mold layer on the substrate, patterning the second support layer to form a second support pattern including an opening, removing the second mold layer to expose portions of sidewalls of the lower electrodes, and etching the exposed sidewalls of the lower electrodes.

24 Claims, 14 Drawing Sheets

(56) References Cited

U.S. PATENT DOCUMENTS

| | | | |
|---|---|---|---|
| 2005/0040448 A1* | 2/2005 | Park | 257/296 |
| 2005/0048717 A1* | 3/2005 | Ito et al. | 438/253 |
| 2006/0033137 A1 | 2/2006 | Lee et al. | |
| 2006/0051918 A1 | 3/2006 | Busch et al. | |
| 2006/0263971 A1* | 11/2006 | Lee et al. | 438/238 |
| 2008/0026538 A1* | 1/2008 | Lee et al. | 438/386 |
| 2008/0042182 A1* | 2/2008 | Park | 257/306 |
| 2008/0045034 A1* | 2/2008 | Shea et al. | 438/738 |
| 2009/0212338 A1 | 8/2009 | Benson | |
| 2010/0155892 A1 | 6/2010 | Benson | |
| 2010/0261331 A1 | 10/2010 | Manning | |
| 2010/0279485 A1* | 11/2010 | Ishikawa | 438/396 |
| 2011/0062552 A1* | 3/2011 | Tsuchiya | 257/532 |

FOREIGN PATENT DOCUMENTS

| | | |
|---|---|---|
| KR | 0375221 B1 | 1/2002 |
| KR | 20050062679 A | 6/2005 |
| KR | 0560633 B1 | 2/2006 |
| KR | 20070066801 A | 6/2007 |
| KR | 20090032880 A | 4/2009 |
| KR | 20100120303 A | 11/2010 |

* cited by examiner

SEMICONDUCTOR MEMORY DEVICES AND METHODS OF FORMING THE SAME

CROSS-REFERENCE TO RELATED APPLICATIONS

This U.S. non-provisional patent application claims priority under 35 U.S.C. §119 to Korean Patent Application No. 10-2012-0021676, filed on Mar. 2, 2012, the entire contents of which are incorporated by reference herein.

BACKGROUND

Example embodiments of inventive concepts relate to semiconductor memory devices and/or methods of forming the same and, more particularly, to semiconductor memory devices including capacitors and/or methods of forming the same.

Recently, lightness, small size, high speed, multi-function, high performance, high reliability, and/or low cost of products have been increasingly demanded in the electronic industry for products such as mobile phones and/or notebook computers.

High integration and improved reliability of semiconductor memory devices have been demanded for satisfying the above demands.

Capacitance of capacitors in the semiconductor memory devices may be increased for improving the reliability of the highly-integrated semiconductor memory device. As an aspect ratio of a lower electrode in the capacitor becomes increased, the capacitance of the capacitor may become increased. Thus, various research has been conducted for a process technique to form capacitors having a high aspect ratio.

SUMMARY

Example embodiments of inventive concepts relate to semiconductor memory devices with improved reliability and/or methods of forming the same.

According to example embodiments of inventive concepts, a method of forming a semiconductor memory device may include: sequentially forming a first mold layer, a first support layer, a second mold layer, and a second support layer on a substrate; forming lower electrodes that penetrate the second support layer, the second mold layer, the first support layer, and the first mold layer on the substrate; patterning the second support layer to form a second support pattern, the second support pattern including an opening; removing the second mold layer to expose sidewalls of portions of the lower electrodes; and etching the exposed sidewalls of the portions of the lower electrodes.

In example embodiments of inventive concepts, the lower electrodes may be spaced apart from each other, and each of the lower electrodes may vertically penetrate the second support layer, the second mold layer, the first support layer, and the first mold layer, and the lower electrodes may be electrically connected to the substrate. The opening of the second support pattern may expose a portion of the second mold layer before removing the second mold layer.

In example embodiments of inventive concepts, removing the second mold layer may include: wet-etching the second mold layer through the opening of the second support pattern. Etching the exposed sidewalls of the portions the lower electrodes may include: performing a wet etching process to reduce widths of the exposed portions of lower electrodes.

In example embodiments of inventive concepts, the method may further include: patterning the first support layer to form a first support pattern, the first support pattern including an opening that exposes a portion of the first mold layer; and removing the first mold layer through the opening the first support pattern. The method may further include: forming a capacitor dielectric layer covering surfaces of the lower electrodes on the substrate; and forming an upper electrode layer on the capacitor dielectric layer.

In example embodiments of inventive concepts, the forming the lower electrodes may include forming the lower electrodes so a middle portion of the lower electrodes penetrates the first support pattern. A top surface of the second support pattern may be substantially coplanar with top surfaces of the lower electrodes. Each of the lower electrodes may have a pillar-shape. The method may further include: forming an etch stop layer on the substrate before forming the first mold layer. In this case, a bottom surface of the etch stop layer may be substantially coplanar with bottom surfaces of the lower electrodes. The first and second mold layers may include silicon oxide, and the first and second support layers may include silicon nitride or germanium oxide.

According to example embodiments of inventive concepts, a semiconductor memory device may include: lower electrodes on a substrate; a capacitor dielectric layer covering surfaces of the lower electrodes; an upper electrode layer covering the capacitor dielectric layer and the lower electrodes; a first support pattern surrounding middle portions of the lower electrodes; and a second support pattern surrounding upper portions of the lower electrodes. The lower electrodes may include sidewalls that define first recessed regions that are adjacent to a bottom surface of the second support pattern, respectively, and each of the first recessed regions may be laterally recessed toward an inside of one of the lower electrodes.

In example embodiments of inventive concepts, the sidewalls of the lower electrodes further define second recessed regions that are adjacent to a top surface of the first support pattern, respectively, and each of the second recessed regions may be laterally recessed toward the inside of one of the lower electrodes.

In example embodiments of inventive concepts, each of the first and second support patterns may define openings, and sidewalls of the first support pattern in the openings of the first support pattern may contact the lower electrodes, and sidewalls of the second support pattern in the openings of the second support pattern may contact the lower electrodes.

According to example embodiments of inventive concepts, a method of forming a semiconductor memory device includes forming a stacked structure on a substrate. The stacked structure may include a plurality of lower electrodes in a plurality of holes defined by a plurality of mold layers and support layers alternately stacked, where the plurality of lower electrodes are spaced apart and each include an upper portion between two of the plurality of support layers. The method may further include exposing sidewalls of the upper portions of the plurality of lower electrodes by removing one of the plurality of mold layers, and etching the exposed sidewalls of the plurality of lower electrodes.

In example embodiments of inventive concepts, the forming the stacked structure may include: forming an etch stop layer, a first mold layer of the plurality of mold layers, a first support layer of the plurality of support layers, a second mold layer of the plurality of mold layers, and a second support layer of the plurality of support layers sequentially stacked on the substrate; patterning the etch stop layer, the first mold layer, the first support layer, the second mold layer, and the second support layer to form a plurality of openings spaced apart from each other and defined by the etch stop layer, the first mold layer, the first support layer, the second mold layer, and the second support layer; and forming the lower electrodes in the plurality of openings, the plurality of openings corresponding to the plurality of holes defined by the plurality of mold layers and support layers alternately stacked.

In example embodiments of inventive concepts, the method may further include: forming an ILD pattern on the substrate, the ILD pattern defining a plurality of holes that expose the substrate; and forming a plurality of contact plugs in the plurality of holes of the ILD pattern. The forming the stacked structure on the substrate may include: forming the stacked structure on the ILD pattern, and forming the lower electrodes on the plurality of contact plugs.

In example embodiments of inventive concepts, the method may further include: forming an upper-electrode hole in the stacked structure by patterning an upper one of the two support layers (in which the upper portions of the plurality of lower electrodes are between) before the exposing the sidewalls of the upper portions of the plurality of lower electrodes, patterning a lower one of the two support layers (in which the upper portions of the plurality of lower electrodes are between) after the partially etching the exposed sidewalls of the plurality of lower electrodes, and removing an other of the plurality of mold layers from below the lower one of the two support layers; forming a capacitor dielectric layer covering surfaces of the plurality of lower electrodes, the capacitor dielectric layer defining voids between the plurality of electrodes; and forming an upper electrode in the upper-electrode hole of the stacked structure and the voids defined by the capacitor dielectric layer.

In example embodiments of inventive concepts, a controller may be connected to a semiconductor memory device formed by one the foregoing methods.

BRIEF DESCRIPTION OF THE DRAWINGS

The foregoing and other features and advantages of example embodiments of inventive concepts will become more apparent from the more particular description of non-limiting embodiments, as illustrated in the attached drawings and accompanying detailed description, in which like reference characters refer to the same parts throughout the different views. The drawings are not necessarily to scale, emphasis instead being placed upon illustrating the principles of inventive concepts. In the drawings.

DETAILED DESCRIPTION OF THE EMBODIMENTS

Figure 1A:
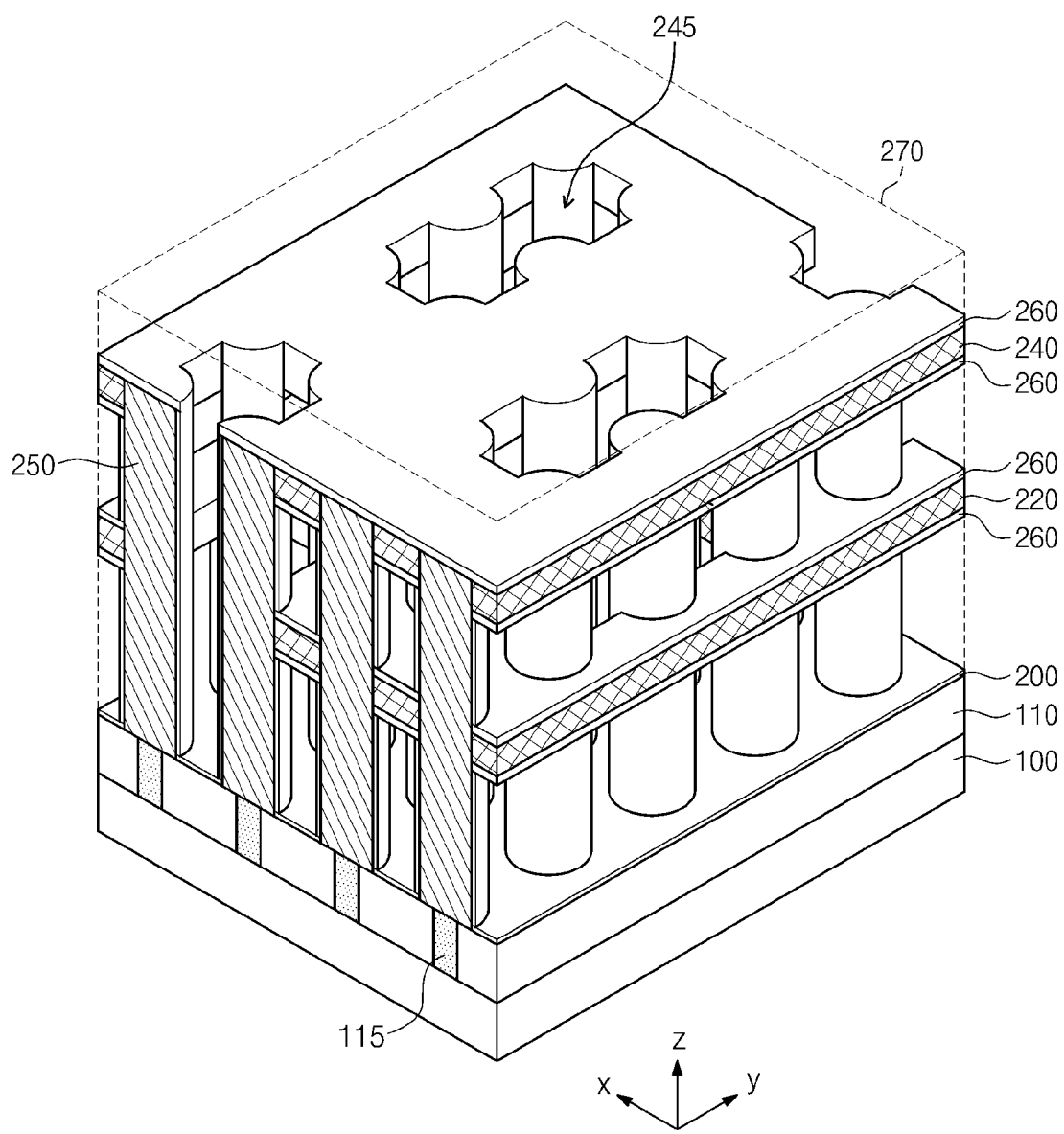
FIG. 1A is a perspective view illustrating a semiconductor memory device according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

The terminology used herein is for the purpose of describing particular embodiments only and is not intended to be limiting of example embodiments. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments of inventive concepts are described herein with reference to cross-sectional illustrations that are schematic illustrations of idealized embodiments (and intermediate structures) of example embodiments of inventive concepts. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It will be also understood that although the terms first, second, third etc. may be used herein to describe various elements, regions, layers and/or sections, these elements, components, regions, layers and/or sections should not be limited by these terms. These terms are only used to distinguish one element from another element, component, region, layer or section. Thus, a first element, component, region, layer or section discussed below could be termed a second element, component, region, layer or section without departing from the teachings of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
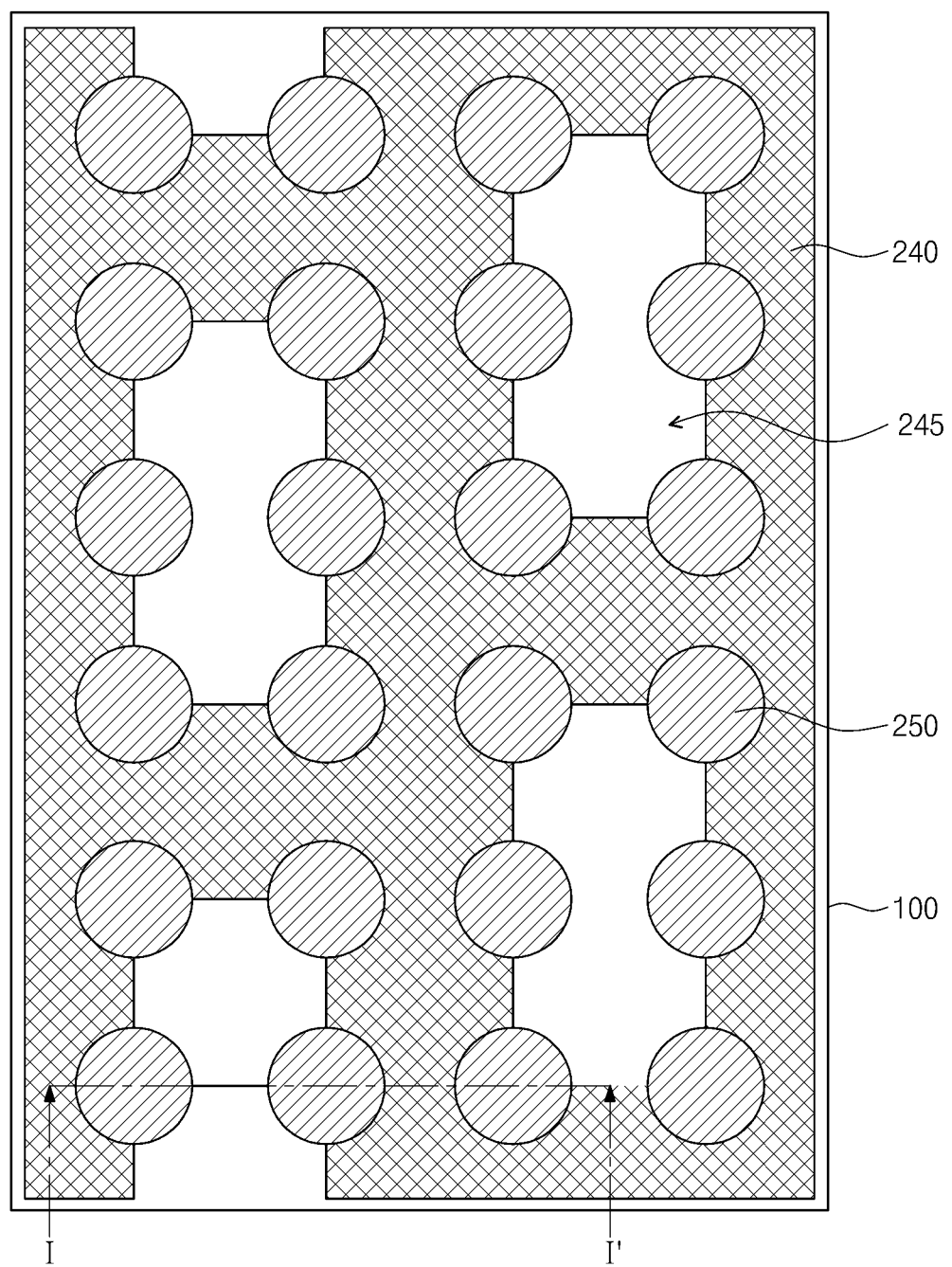
FIG. 1B is a plan view illustrating the semiconductor memory device of FIG. 1A when viewed from a top view.
Figure 1C:
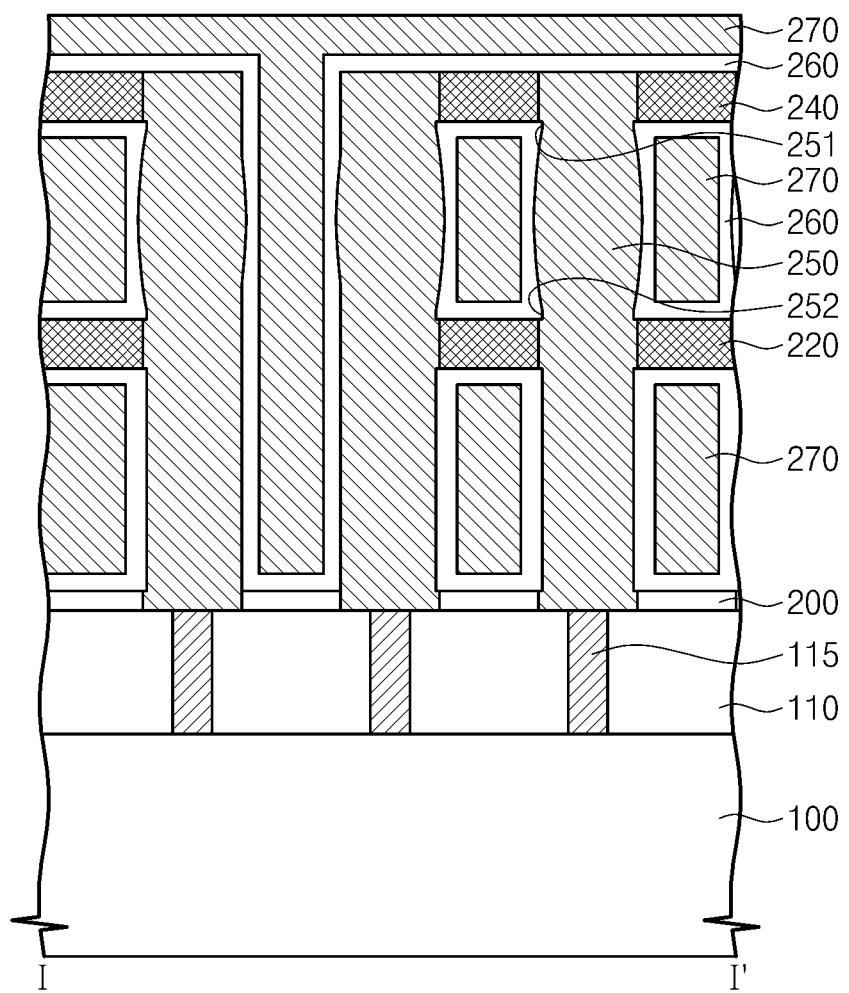
FIG. 1C is a cross-sectional view taken along a line I-I' of FIG. 1B.

FIG. 1A is a perspective view illustrating a semiconductor memory device according to example embodiments of inventive concepts, FIG. 1B is a plan view illustrating the semiconductor memory device of FIG. 1A when viewed from a top view, and FIG. 1C is a cross-sectional view taken along a line I-I' of FIG. 1B. A capacitor dielectric layer and an electrode layer are omitted in FIG. 1B for the purpose of ease and convenience in explanation.

Referring to FIGS. 1A to 1C, an interlayer dielectric layer 110 may be disposed on a substrate 100. The substrate 100 may be a semiconductor substrate, for example, a silicon substrate, a germanium substrate, or a silicon-germanium substrate. The interlayer dielectric layer 110 may include a dielectric material. For example, the interlayer dielectric layer 110 may include at least one of oxide, nitride, and oxynitride. For example, the interlayer dielectric layer 110 may include at least one of silicon oxide, silicon nitride, and silicon oxynitride. However, example embodiments of inventive concepts are not limited thereto.

Contact plugs 115 may penetrate the interlayer dielectric layer 110 and may be disposed on the substrate 100. The contact plugs 115 may include at least one of a semiconductor material (e.g., poly silicon), a metal-semiconductor compound (e.g., a metal silicide compound such as tungsten silicide), a conductor metal nitride (e.g., titanium nitride, tantalum nitride, or tungsten nitride), and a metal (e.g., titanium, tungsten, or tantalum). If the contact plugs 115 are a semiconductor material, the contact plugs 115 may be doped with impurities to improve electrical conductivity.

Even though not shown in the drawings, a plurality of word lines and a plurality of bit lines crossing the word lines may be disposed on the substrate 100, and the interlayer dielectric layer 110 may cover the word lines and bit lines. Doped regions may be disposed in the substrate 100 at both sides of each of the word lines, and each of the contact plugs 115 may be connected to one of the doped regions.

Lower electrodes 250 may be disposed on the interlayer dielectric layer 110 and extend in a direction vertical to the substrate 100 (e.g., a z-axis direction). Each of the lower electrodes 250 may be electrically connected to each of the contact plugs 115. In example embodiments of inventive concepts, a bottom surface of the lower electrodes 250 may be in contact with a top surface of the contact plug 115.

In example embodiments of inventive concepts, the lower electrodes 250 may have a pillar-shape. However, example embodiments of inventive concepts are not limited thereto. The lower electrode 250 may have one of various shapes, for example, a cylinder-shape or a hybrid cylinder-shape (e.g., combination of a pillar-shape and a cylinder-shape). As a non-limiting example, FIG. 1 illustrates the lower electrodes 250 having the pillar-shapes.

In example embodiments of inventive concepts, if the lower electrode 250 has the cylinder-shape, the lower electrode 250 may include a plate portion extending in parallel with the substrate a sidewall portion upward extending from an edge of the plate portion. A bottom surface of the plate portion of the lower electrode 250 may be in contact with the top surface of the contact plug 115.

The lower electrodes 250 may include a conductive material. For example, the lower electrodes 250 may include at least one of a doped semiconductor material, a conductive metal nitride (e.g., titanium nitride, tantalum nitride, or tungsten nitride), a metal (e.g., ruthenium, iridium, titanium, or tantalum), and a conductive metal oxide (e.g., iridium oxide).

An etch stop layer 200 may be disposed on the interlayer dielectric layer 110. In this case, the lower electrodes 250 may penetrate the etch stop layer 220 so as to be in contact with the top surfaces of the contact plugs 115, respectively. In example embodiments of inventive concepts, the etch stop layer 200 may be omitted.

An upper electrode layer 270 may be disposed on the interlayer dielectric layer 110 so as to cover the lower electrodes 250. The upper electrode layer 270 may include at least one of a doped semiconductor material, a conductive metal nitride (e.g., titanium nitride, tantalum nitride, or tungsten nitride), a metal (e.g., ruthenium, iridium, titanium, or tantalum), and a conductive metal oxide (e.g., iridium oxide).

First and second support patterns 220 and 240 may be disposed on the interlayer dielectric layer 110. The first and second support patterns 220 and 240 may be in contact with portions of a sidewall of each of the lower electrodes 250, respectively. Since the first and second support patterns 220 and 240 may be in contact with portions of the sidewalls of the lower electrodes 250, the first and second support patterns 220 and 240 may perform a function supporting the lower electrodes 250. The first and second support patterns 220 and 240 may be covered by the upper electrode layer 270.

In example embodiments of inventive concepts, the first support pattern 220 may be disposed at middle portions of the lower electrodes 240 extending in the z-axis direction so as to support the lower electrode 250. A top surface of the second support pattern 240 may be substantially coplanar with top surfaces of the lower electrodes 250. In example embodiments of inventive concepts, the first and second support patterns 220 and 240 may be disposed at various positions. In example embodiments of inventive concepts, one of the first and second support patterns 220 and 240 may be omitted. In example embodiments of inventive concepts, an additional support pattern may be added on the sidewall of the lower electrode 250. However, example embodiments of inventive concepts are not limited thereto.

In example embodiments of inventive concepts, as illustrated in FIG. 1B, the second support pattern 240 may include a plurality openings 245 penetrating the second support pattern 240. An inner sidewall of each of the openings 245 may be in contact with portions of the sidewalls of some of the lower electrodes 250. In other words, some of the lower electrodes 250 may be surrounded by the inner sidewall of the opening 245 of the second support pattern 240. For example, the inner sidewall of each of the openings 245 may be in contact with portions of the sidewalls of six or eight lower electrodes 250. However, example embodiments of inventive concepts are not limited thereto. The shape of the second support pattern 240 may be changed to one of various shapes. The shape of the first support pattern 220 may be substantially the same as the shape of the second support pattern 240.

A capacitor dielectric layer 260 may be disposed between the upper electrode layer 270 and the lower electrodes 250, between the upper electrode layer 270 and the first support pattern 220, and between the upper electrode layer 270 and the second support pattern 240. The capacitor dielectric layer 260 may cover surfaces of the lower electrodes 250, surfaces of the first and second support patterns 220 and 240, and a top surface of the interlayer dielectric layer 110. The capacitor dielectric layer 260 may include at least one of oxide (e.g., silicon oxide), nitride (e.g., silicon nitride), oxynitride (e.g., silicon oxynitride), and high-k dielectric materials (e.g., hafnium oxide, aluminum oxide, or tantalum oxide).

As illustrated in FIG. 1C, first recessed portions 251 may be respectively disposed at sidewalls of the lower electrodes 250 adjacent to a bottom surface of the second support pattern 240. Additionally, second recessed portions 252 may be respectively disposed at sidewalls of the lower electrodes 250 adjacent to a top surface of the first support pattern 220. The first and second recessed portions 251 and 252 may be laterally recessed with respect to the portions of the sidewall of the lower electrode 250 in contact with the first and second support patterns 220 and 240 toward the inside of the lower electrodes 250. The first and second recessed portions 251 and 252 may be formed during a process etching sidewalls of the lower electrodes 250 in a method of forming a semiconductor memory device According to example embodiments of inventive concepts.

According to example embodiments of inventive concepts, a process of additionally etching portions of the lower electrodes 250 may be performed for reducing (and/or minimizing) a thickness-increase of the lower electrode 250 caused by a bowing phenomenon and a leakage current caused thereby. These will be described in more detail hereinafter.

Next, a method of forming a semiconductor memory device according to example embodiments of inventive concepts will be described. FIGS. 2 to 6 and 8 to 10 are cross-sectional views illustrating a method of forming a semiconductor memory device according to example embodiments of inventive concepts, FIG. 7A is an enlarged view of a portion 'A' of FIG. 5, and FIG. 7B is an enlarged view of a portion 'B' of FIG. 6.

Figure 2:
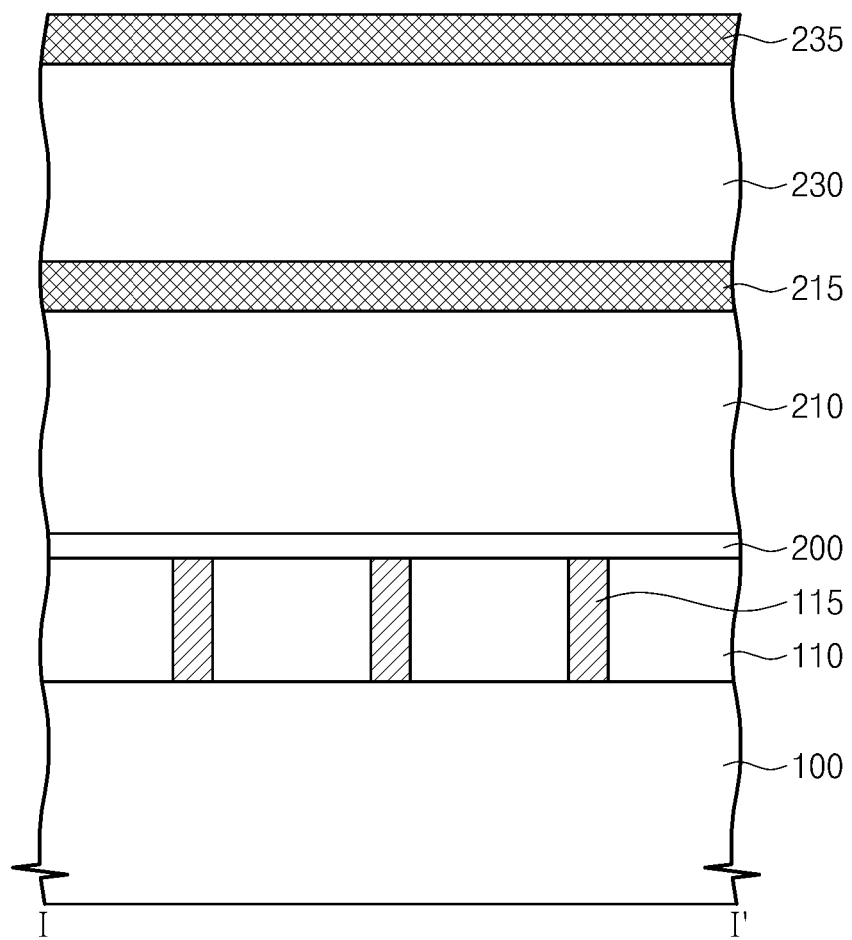
FIGS. 2 to 6 and 8 to 10 are cross-sectional views illustrating a method of forming a semiconductor memory device according to example embodiments of inventive concepts.

Referring to FIG. 2, an interlayer dielectric layer 110 may be formed on a substrate 100. The substrate 100 may include a semiconductor material. For example, the substrate 100 may include a silicon substrate, a silicon-germanium substrate, or a germanium substrate. The interlayer dielectric layer 110 may include a dielectric material. For example, the interlayer dielectric layer 110 may include at least one of an oxide layer, a nitride layer, and an oxynitride layer.

Contact plugs 115 penetrating the interlayer dielectric layer 110 may be formed on the substrate 100. Contact holes may be formed in the interlayer dielectric layer 110 to expose portions of the substrate 100 and then the contact holes may be filled with a conductive material, thereby forming the contact plugs 115. The contact plug 115 may include at least one of a semiconductor material (e.g., poly silicon), a metal-semiconductor compound (e.g., tungsten silicide), a conductor metal nitride (e.g., titanium nitride, tantalum nitride, or tungsten nitride), and a metal (e.g., titanium, tungsten, or tantalum).

Even though not shown in the drawings, a plurality of word lines and a plurality of bit lines crossing each other may be formed on the substrate 100, and the word and bit lines may be covered by the interlayer dielectric layer 110. Doped regions may be formed in the substrate 100 at both sides of each of the word lines. Each of the contact plugs 115 may be connected to one of the doped regions.

In example embodiments of inventive concepts, an etch stop layer 200, a first mold layer 210, a first support layer 215, a second mold layer 230, and a second support layer 235 may be sequentially formed on the interlayer dielectric layer 110. The etch stop layer 200 may be formed of a silicon nitride (SiN) layer. The etch stop layer 200 may be omitted. The first and second mold layers 210 and 230 may include silicon oxide. The first and second support layers 215 and 235 may include silicon nitride and/or germanium oxide (GeO).

Figure 3:
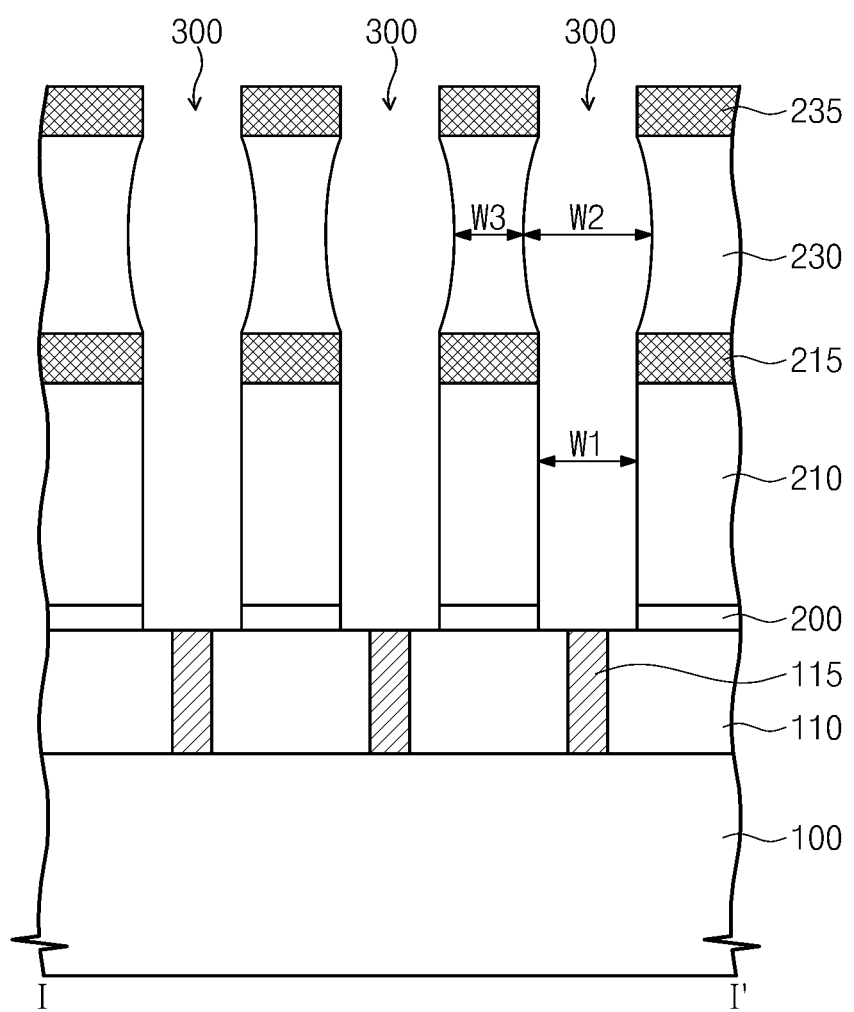

Referring to FIG. 3, through-holes 300 may be formed to successively penetrate the second support layer 235, the second mold layer 230, the first support layer 215, the first mold layer 210, and the etch stop layer 200. The through-holes 300 may extend vertically to the substrate 100 and be laterally spaced apart from each other.

A photomask (not shown) may be formed on the second support layer 235. The second support layer 235, the second mold layer 230, the first support layer 215, and the first mold layer 210 may be successively etched using the photomask as an etch mask to expose the etch stop layer 200, and then the exposed etch stop layer 200 may be etched to expose top surfaces of the contact plugs 115. Thus, the through-holes 300 may be formed.

In example embodiments of inventive concepts, the through-holes 300 may be formed by etching the first support layer 235, the second mold layer 230, the first support layer 215, the first mold layer 210, and the etch stop layer 220 in one reaction chamber. Alternatively, the first support layer 235, the second mold layer 230, the first support layer 215, the first mold layer 210, and the etch stop layer 220 may be respectively etched in reaction chambers different from each other to form the through-holes 300. In embodiments of inventive concepts, the through-holes 300 may be not limited to contact holes or storage node holes and may be formed to have various shapes except holes.

As illustrated in FIG. 3, a bowing phenomenon may result from etching the first support layer 235, the second mold layer 230, the first support layer 215, the first mold layer 210, and the etch stop layer 220. For example, if the first and second support layers 215 and 235 include silicon nitride, the first and second mold layers 210 and 230 including silicon oxide may be etched more than the first and second support layers 215 and 235. Thus, a width of a portion of the through-hole 300 in the first and second mold layers 210 and 230 may be greater than that of a portion of the through-hole 300 in the support layers 215 and 235. In other words, the width of the through-hole 300 may be non-uniform.

Alternatively, for the formation of the through-hole 300, the first support 215 and the first mold layer 210 sequentially etched after etching the second mold layer 230. In this case, the second mold layer 230 may be continuously exposed in the etching process the first support layer 215 and the first mold layer 210. Thus, the second mold layer 230 may be etched more. As a result, the through-hole 300 in the second mold layer 230 may be formed to have a width W2 greater than a desired width W1.

If the bowing phenomenon described above occurs, when lower electrodes are formed in the through-holes 300, respectively, a distance W3 between the lower electrodes adjacent to each other may be reduced. When the distance W3 is reduced, a leakage current between the lower electrodes may be increased.

Figure 4:
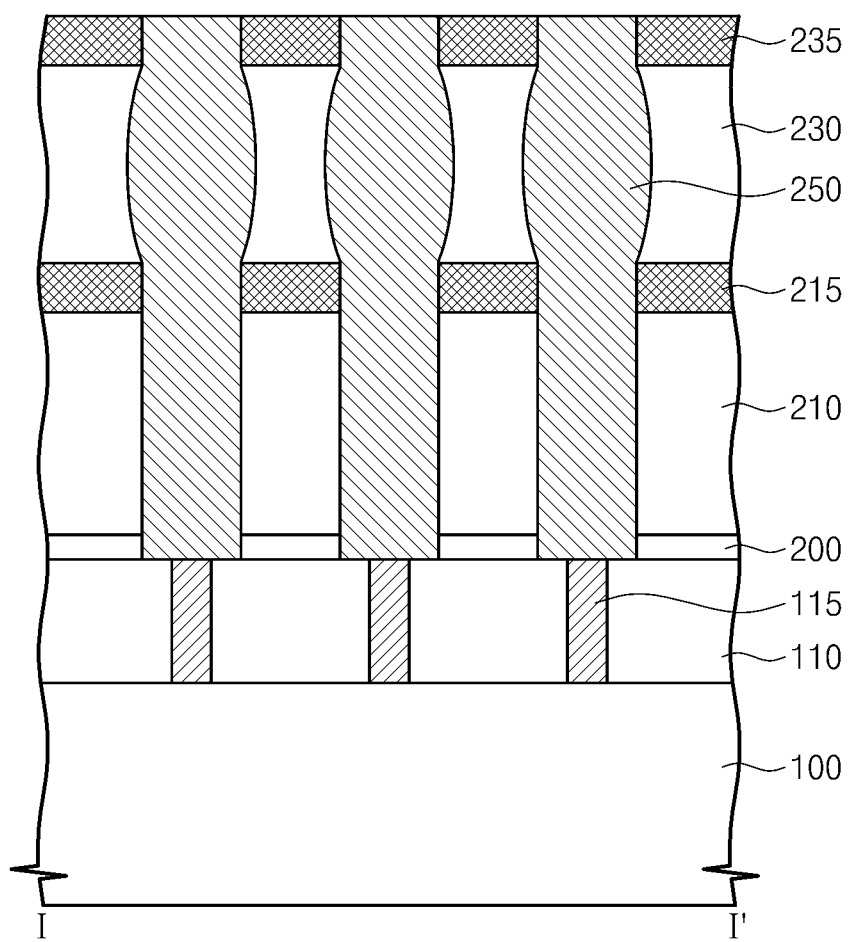
Figure 5:
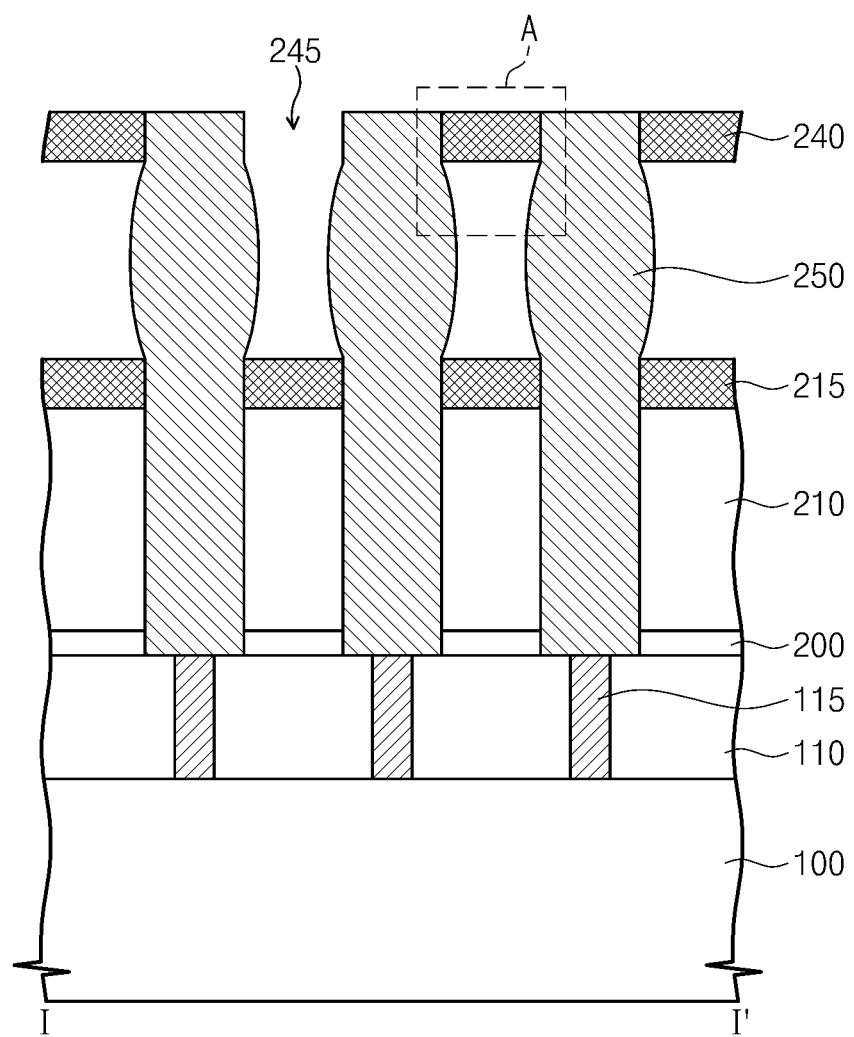

Referring to FIG. 4, lower electrodes 250 may be formed to fill the through-holes 300, respectively. A lower electrode layer may be formed to fill the through-holes 300 and then the lower electrode layer may be planarized until the second support layer 235) is exposed, thereby forming the lower electrodes 250. Alternatively, the lower electrode layer may be deposited to cover inner sidewalls of the through-holes 300, a sacrificial layer (not shown) may be formed on the lower electrode layer to fill the through-holes 300, and then the sacrificial layer and the electrode layer may be planarized until the second support layer 235 is exposed. In this case, the lower electrodes 250 may be formed to have the cylinder-shapes. The planarization process may be performed using a chemical-mechanical polishing technique. The sacrificial layer (not shown) may be formed of the same material as the first and the second mold layer 210 and 230.

The lower electrode layer may be formed using a physical vapor deposition (PVD) process or a chemical vapor deposition (CVD) process. The lower electrodes 250 may include at least one of a doped semiconductor layer, a conductive metal nitride layer (e.g., a titanium nitride layer, a tantalum nitride layer, or a tungsten nitride layer), a metal layer (e.g., a ruthenium layer, an iridium layer, a titanium layer, or a tantalum layer), and a conductive metal oxide layer (e.g., an iridium oxide layer).

Each of the lower electrodes 250 formed in each of the through-holes 300 may be electrically connected to each of the contact plugs 115. The lower electrodes in the through-holes 300 may be spaced apart from each other.

Referring to FIG. 5, the second support layer 235 (see FIG. 4) may be patterned to form a second support pattern 240. As illustrated in FIG. 1B, the second support pattern 240 may include openings 245 formed by etching portions of the second support layer 235.

Each of the openings 245 may expose portions of sidewalls of some of the lower electrodes 250. In other words, some of the lower electrodes 250 may be surrounded by each of the openings 245 of the second support pattern 240. For example, each of the openings 245 may expose the portions of the sidewalls of six or eight lower electrodes 250. However, example embodiments of inventive concepts are not limited thereto. The second support pattern 240 may be disposed in various shapes. The openings 245 may expose the second mold layer 230

Subsequently, the second mold layer 230 may be removed through the openings 245 of the second support pattern 240. Portions of sidewalls of the lower electrodes 250 and a top surface of the first support layer 215 may be exposed by the removal of the second mold layer 230. In example embodiments of inventive concepts, the second mold layer 230 may be removed by a process using a solution including ammonium fluoride ($NH_4F$) and hydrofluoric acid (HF).

Figure 6:
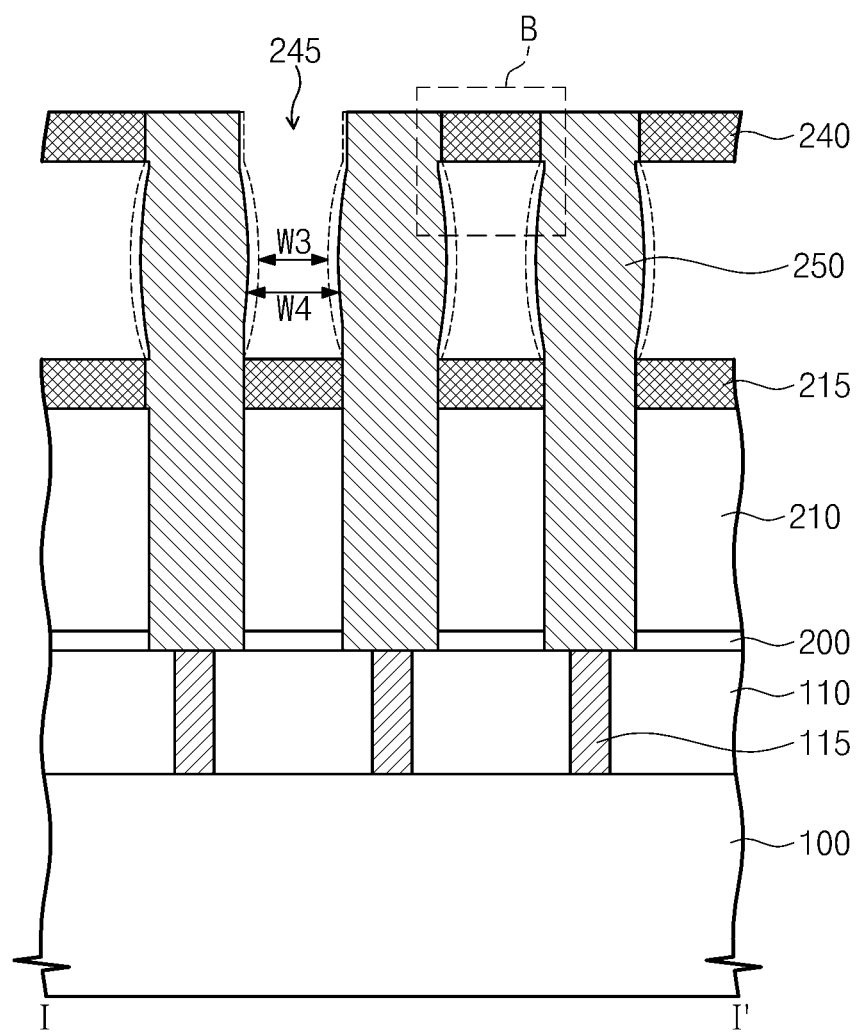
Figure 7A:
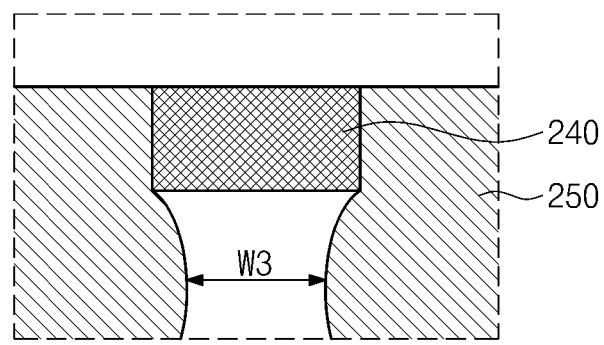
FIG. 7A is an enlarged view of a portion 'A' of FIG. 5.
Figure 7B:
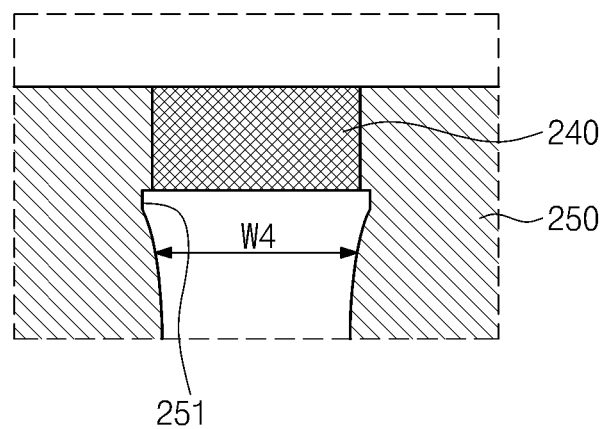
FIG. 7B is an enlarged view of a portion 'B' of FIG. 6.

Referring to FIG. 6, a lower electrode-etching process is performed on the substrate 100 which the second mold layer 230 is removed from. The lower electrode-etching process may include a process that etches portions of the lower electrodes 250 that are exposed by the openings 245 of the second support pattern 240 and the removal of the second mold layer 230. For example, the lower electrode-etching process may etch the exposed sidewalls of the lower electrodes 250 to reduce widths of the lower electrodes 250. At this time, during the lower electrode-etching process, the first support layer 215 may protect lower portions of the lower electrodes 250 that are surrounded by the first support layer 215, the first mold layer 210, and the etch stop layer 200. In other words, upper portions of the lower electrodes 250 having increased widths by the bowing phenomenon of FIG. 3 may be etched by the lower electrode-etching process but the lower portions of the lower electrodes 250 may be protected b the first support layer 215.

The lower electrode-etching process may be performed by a wet etching process, for example, a wet etching process using a solution including ammonium fluoride ($NH_4F$) and hydrofluoric acid (HF). For example, the lower electrode-etching process may use the same etching solution as the process removing the second mold layer 230. However, example embodiments of inventive concepts are not limited thereto.

Since the lower electrode-etching process is performed, a distance W4 between the lower electrodes 250 adjacent to each other may increase. In other words, widths of the through-holes 300 may increase by the bowing phenomenon and the distance W3 between the lower electrodes 250 filling the through-holes 300 may be narrow, such that the leakage current may occur. However, according to example embodiments of inventive concepts, after the second mold layer 230 is removed, the lower electrode-etching process is further performed to etch the exposed sidewalls of the lower electrodes 250. Thus, the bowing phenomenon may be reduced (and/or minimized). That is, the distance W4 between the lower electrodes 250 adjacent to each other may increase by the lower electrode-etching process, such that the leakage current may be prevented and/or reduced (and/or minimized). As a result, the semiconductor memory device with relatively higher reliability may be realized.

FIG. 7A is an enlarged view of a portion 'A' of FIG. 5 and illustrates the lower electrode before performing the lower electrode-etching process. Referring to FIG. 7A, portions of the lower electrodes 250 adjacent to a bottom surface of the second support pattern 240 may have widths increased by the bowing phenomenon. Thus, the distance W3 between the lower electrodes 250 adjacent to each other may be narrow to increase the leakage current.

FIG. 7B is an enlarged view of a portion 'B' of FIG. 6 and illustrates the lower electrode after performing the lower electrode-etching process. Referring to FIG. 7B, first recessed portions 251 may be respectively formed at sidewalls of the lower electrodes 250 that are adjacent to the bottom surface of the second support patterns 240. The first recessed portions 251 may be laterally recessed with respect to a sidewall of a portion of the lower electrode 250 in contact with the second support pattern 240 toward the inside of the lower electrode 250. In other words, since the lower electrode-etching process is performed, the first recessed portions 251 may be formed and the exposed sidewalls of the lower electrodes 250 may be etched. As a result, the distance W4 between the lower electrodes 250 adjacent to each other may increase to reduce (and/or prevent) the leakage current. Thus, the semiconductor memory device with relatively higher reliability may be realized.

Likewise, second recessed portions 252 may be formed at sidewalls of portions of the lower electrodes 250 adjacent to a top surface of the first support layer 215, respectively. The second recessed portions 252 may be laterally recessed with respect to a sidewall of a portion of the lower electrode 250 in contact with the first support layer 215 toward the inside of the lower electrode 250.

Figure 8:
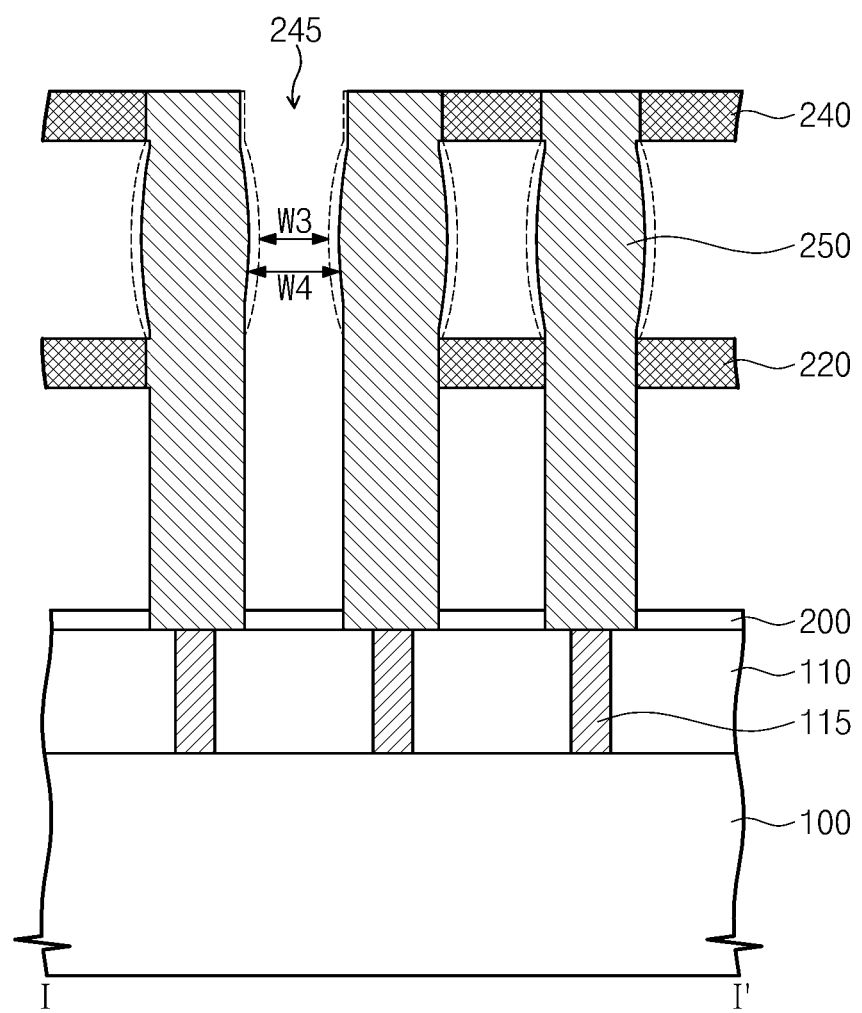

Referring to FIG. 8, the first support layer 215 may be patterned to form a first support pattern 220. And then the first mold layer 210 may be removed. The first support pattern 220 may be formed by the same method as the second support pattern 220. In other words, the first support pattern 220 may include openings 225 formed by etching portions of the first support layer 215. The first mold layer 210 may be removed by the openings 225 of the first support pattern 220. At this time, the etch stop layer 200 may limit (and/or prevent) the interlayer dielectric layer 110 from being etched during the process of removing the first mold layer 210. After the first mold layer 210 is removed, a process to remove residues may be further performed.

Figure 9:
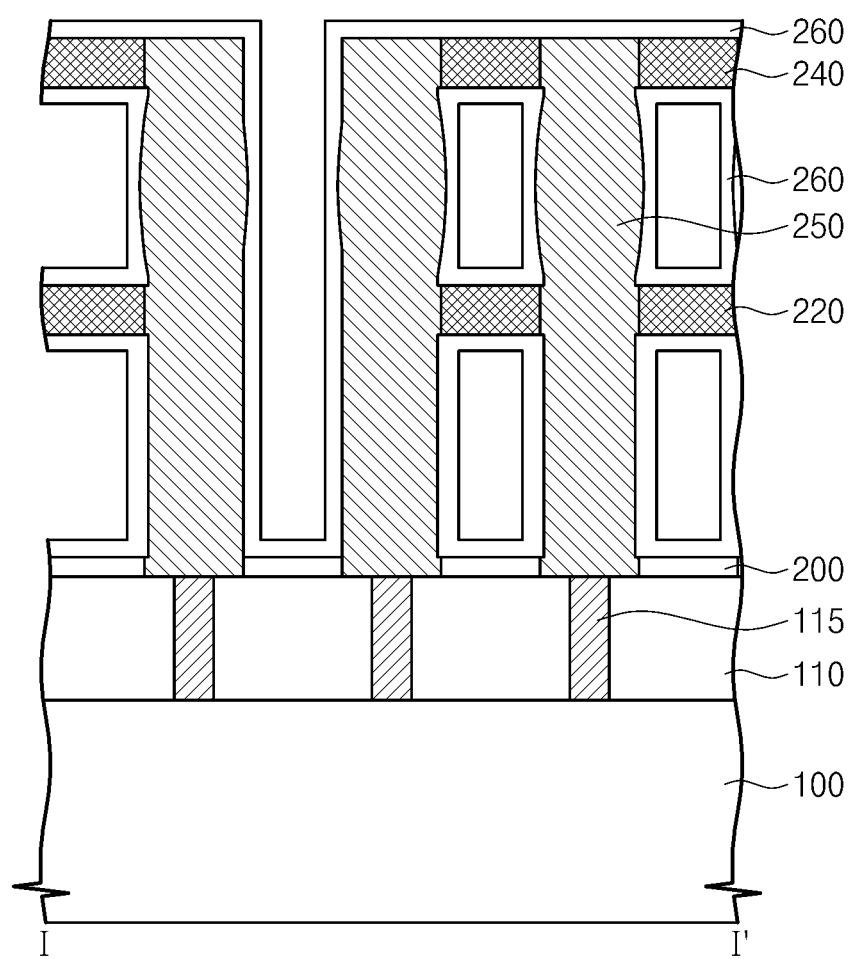

Referring to FIG. 9, a capacitor dielectric layer 260 may be conformally formed on the substrate 100 where the first and second support patterns 220 and 240 are exposed. The capacitor dielectric layer 260 may be conformally formed along surfaces of the lower electrodes 250, surfaces of the first and second support patterns 220 and 240, and a top surface of the etch stop layer 200. The capacitor dielectric layer 260 may include at least one of an oxide layer (e.g., a silicon oxide layer), a nitride layer (e.g., a silicon nitride layer), an oxynitride layer (e.g., a silicon oxynitride layer), and a high-k dielectric material layers (e.g., a hafnium oxide layer, an aluminum oxide layer, or a tantalum oxide layer). The capacitor dielectric layer 260 may electrically separate the lower electrodes 250 from an upper electrode layer formed by a subsequent process. The capacitor dielectric layer 260, the lower electrode 250 and the upper electrode layer (see 270 in FIG. 10) may constitute a capacitor.

Figure 10:
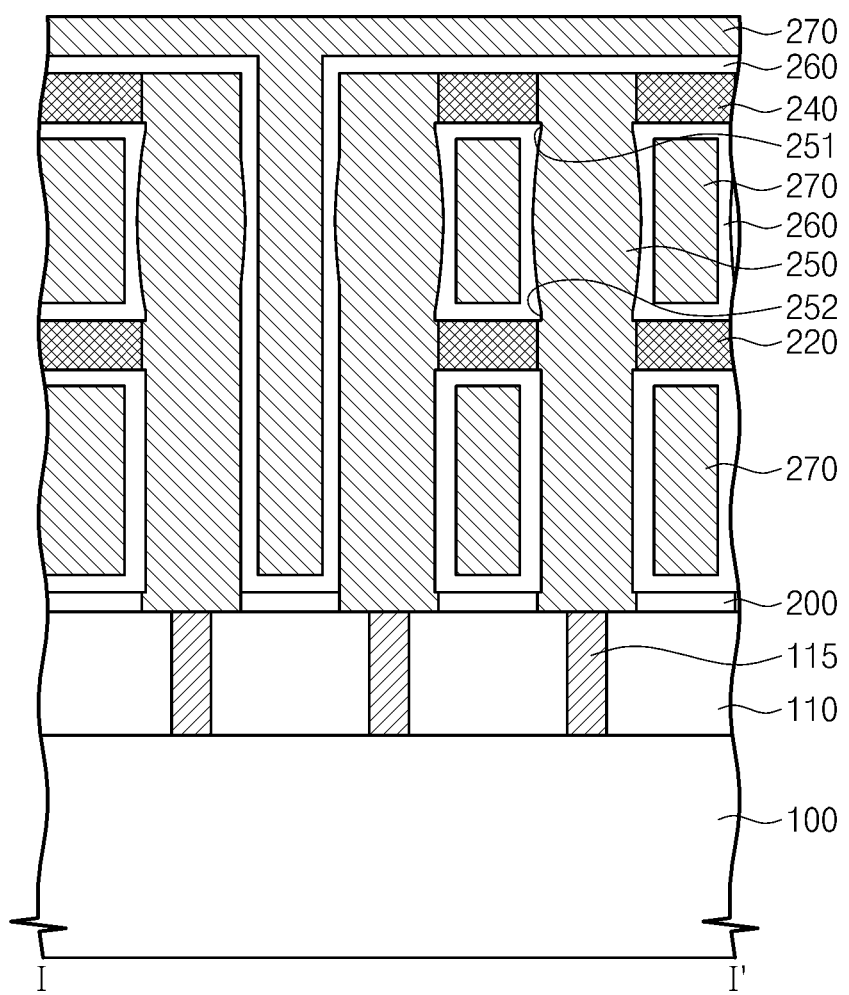

Referring to FIG. 10, the upper electrode layer 270 may be formed on the capacitor dielectric layer 260. The upper electrode layer 270 may fill empty regions formed by the removal of the first and second mold layers 210 and 230. As a result, the capacitor dielectric layer 260 may be disposed between the upper electrode layer 270 and the lower electrodes 250 and between the upper electrode layer 270 and the first and second support patterns 220 and 240. The upper electrode layer 270 may include at least one of a doped semiconductor layer, a conductive metal nitride layer (e.g., a titanium nitride layer, a tantalum nitride layer, or a tungsten nitride layer), a metal layer (e.g., a ruthenium layer, an iridium layer, a titanium layer, or a tantalum layer), and a conductive metal oxide layer (e.g., an iridium oxide layer).

According to example embodiments of inventive concepts, after the second mold layer 230 is removed, the lower electrode-etching process may be further performed to etch the exposed sidewalls of the lower electrodes 250. Thus, the bowing phenomenon may be reduced and/or resolved. In other words, the distance between the lower electrodes 250 adjacent to each other may increase by the lower electrode-etching process, such that the leakage current between the lower electrodes 250 may be reduced (and/or minimized or prevented). As a result, a semiconductor memory device with relatively higher reliability may be realized.

The semiconductor memory devices described in the above embodiments may be encapsulated using various packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which one or more semiconductor memory device according to example embodiments of inventive concepts is mounted may further include at least one semiconductor device (e.g., a controller and/or a logic device) that controls the semiconductor memory device.

Figure 11:
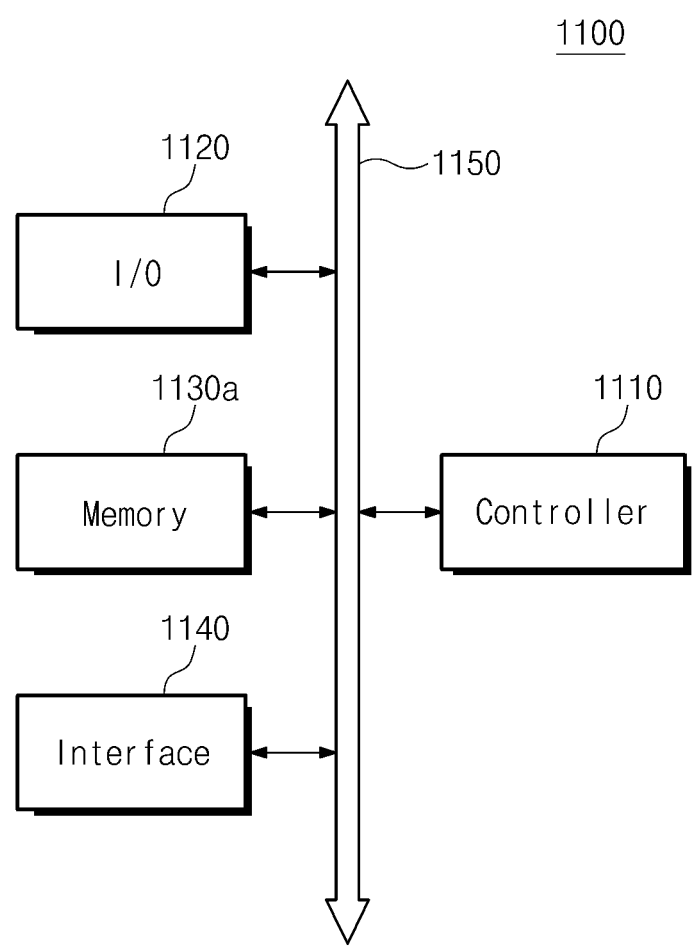
FIG. 11 is a schematic block diagram illustrating an example of electronic systems including semiconductor memory devices according to example embodiments of inventive concepts.

FIG. 11 is a schematic block diagram illustrating an example of electronic systems including semiconductor memory devices According to example embodiments of inventive concepts.

Referring to FIG. 11, an electronic system 1100 according to example embodiments of inventive concepts may include a controller 1110, an input/output (I/O) unit 1120, a memory device 1130a, an interface unit 1140 and a data bus 1150. At least two of the controller 1110, the I/O unit 1120, the memory device 1130a and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or other logic devices. The other logic devices may have a similar function to any one of the microprocessor, the digital signal processor and the microcontroller. The I/O unit 1120 may include a keypad, a keyboard and/or a display unit. The memory device 1130a may store data and/or commands. The memory device 1130a may include at least one of the semiconductor memory devices according to example embodiments of inventive concepts described above. The memory device 1130a may further include another type of semiconductor memory devices which are different from the semiconductor memory devices according to example embodiments of inventive concepts. For example, the memory device 1130a may further include a non-volatile memory device (e.g. a magnetic memory device, a phase change memory device, etc.), a dynamic random access memory (DRAM) device and/or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless data transmission.

Figure 12:
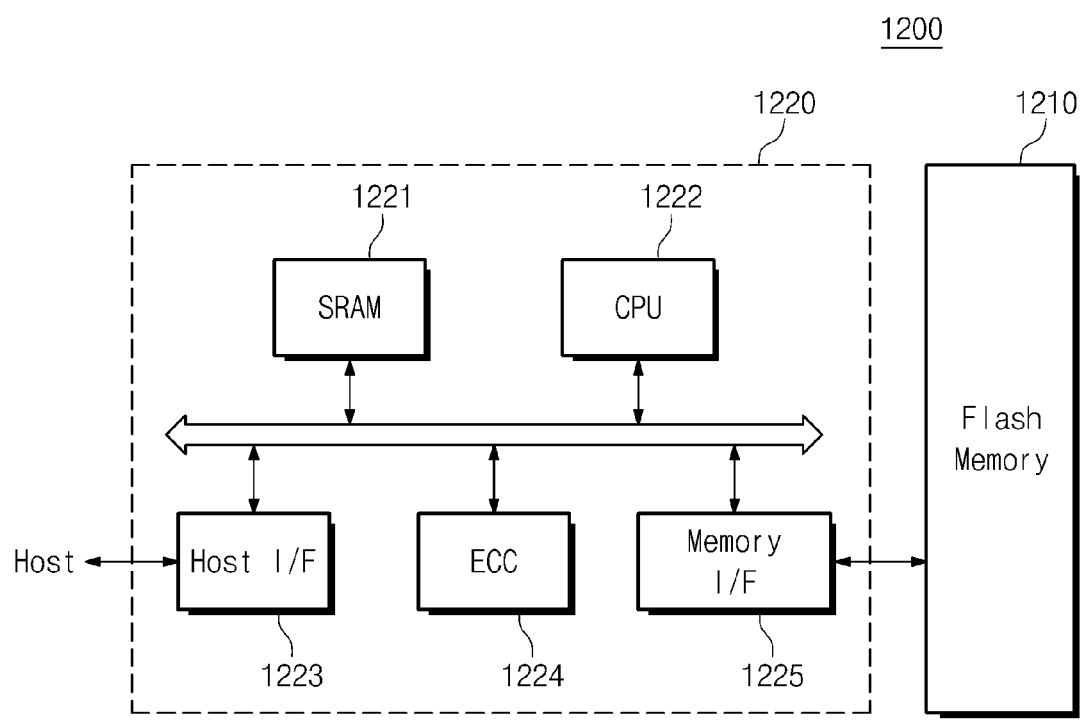
FIG. 12 is a schematic block diagram illustrating an example of memory cards including semiconductor memory devices according to example embodiments of inventive concepts.

FIG. 12 is a schematic block diagram illustrating an example of memory cards including semiconductor memory devices according to example embodiments of inventive concepts.

Referring to FIG. 12, a memory card 1200 according to example embodiments of inventive concepts may include a memory device 1210. The memory device 1210 may include flash memory devices. Additionally, the memory device 1210 may include at least one semiconductor memory device according to example embodiments, as described above. In example embodiments of inventive concepts, the memory device 1210 may further include another type of semiconductor memory devices that is different from semiconductor memory devices according to example embodiments of inventive concepts, as described above. For example, the memory device 1210 may further include a non-volatile memory device (e.g. a magnetic memory device, a phase change memory device, etc.), a dynamic random access memory (DRAM) device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

According to example embodiments of inventive concepts, after removing the second mold layer disposed beside the upper portion of the lower electrode, an additional etching process (e.g., the lower electrode-etching process) may be performed to etch the sidewall of the exposed upper portion of the lower electrode. Thus, the width of the lower electrode, which may increase by the bowing phenomenon, may be reduced.

Since the width of the lower electrode may be reduced by the lower electrode-etching process, the distance between the adjacent lower electrodes may increase. Thus, the leakage current may be reduced (and/or prevented or minimized). As a result, the semiconductor memory device with relatively higher reliability may be realized.

While some example embodiments of inventive concepts have been particularly shown and described, it will be apparent to those skilled in the art that various changes and modifications may be made without departing from the spirit and scope of inventive concepts. Therefore, it should be understood that the above-discussed example embodiments of inventive concepts are not limiting, but illustrative. Thus, the scope of the following claims and their equivalents, and shall not be restricted or limited by the foregoing description.

What is claimed is:

1. A method of forming a semiconductor memory device, comprising:
  sequentially forming a first mold layer, a first support layer, a second mold layer, and a second support layer on a substrate;
  forming lower electrodes that penetrate the second support layer, the second mold layer, the first support layer, and the first mold layer on the substrate, each of the lower electrodes including a lower portion in the first mold layer and an upper portion in the second mold layer, a width of the upper portion being greater than a width of the lower portion;
  patterning the second support layer to form a second support pattern, the second support pattern including an opening;
  removing the second mold layer to expose sidewalls of the upper portions of the lower electrodes, wherein the exposed sidewalls of the upper portions of the lower electrodes are disposed between the second support pattern and the first support layer vertically spaced apart from each other; and
  etching the exposed sidewalls of the upper portions of the lower electrodes to increase a distance between the upper portions of the lower electrodes adjacent to each other, after the removing the second mold layer.

2. The method of claim 1, wherein
  the lower electrodes are spaced apart from each other;
  each of the lower electrodes vertically penetrates the second support layer, the second mold layer, the first support layer, and the first mold layer, and
  the lower electrodes are electrically connected to the substrate.

3. The method of claim 1, wherein the opening of the second support pattern exposes a portion of the second mold layer before the removing the second mold layer.

4. The method of claim 1, wherein the removing the second mold layer includes:
  wet-etching the second mold layer through the opening of the second support pattern.

5. The method of claim 1, wherein etching the exposed sidewalls of the portions of the lower electrodes includes:
  performing a wet etching process to reduce widths of the exposed portions of the lower electrodes.

6. The method of claim 1, further comprising:
  patterning the first support layer to form a first support pattern,
    the first support pattern including an opening that exposes a portion of the first mold layer; and
  removing the first mold layer through the opening of the first support pattern.

7. The method of claim 6, wherein the forming lower electrodes includes:
  forming the lower electrodes so a middle portion of the lower electrodes penetrates the first support pattern.

8. The method of claim 1, further comprising:
  forming a capacitor dielectric layer covering surfaces of the lower electrodes on the substrate; and
  forming an upper electrode layer on the capacitor dielectric layer.

9. The method of claim 1, wherein a top surface of the second support pattern is substantially coplanar with top surfaces of the lower electrodes.

10. The method of claim 1, wherein the forming lower electrodes includes:
  forming each of the lower electrodes as a pillar-shape.

11. The method of claim 1, further comprising:
forming an etch stop layer on the substrate before forming the first mold layer, wherein the forming the lower electrodes includes,
forming through-holes through the second support layer, the second mold layer, the first support layer, the first mold layer, and the etch stop layer, and
forming the lower electrodes in the through-holes so a bottom surface of the etch stop layer is substantially coplanar with bottom surfaces of the lower electrodes.

12. The method of claim 1, wherein
the first and second mold layers include silicon oxide; and
the first and second support layers include one of silicon nitride and germanium oxide.

13. A method of forming a semiconductor memory device, comprising:
forming a stacked structure on a substrate,
the stacked structure including a plurality of lower electrodes in a plurality of holes defined by a plurality of mold layers and support layers alternately stacked,
the plurality of lower electrodes being spaced apart and each including an upper portion between two of the plurality of support layers and a lower portion, a width of the upper portion being greater than a width of the lower portion;
removing one of the plurality of mold layers to expose sidewalls of the upper portions of the plurality of lower electrodes, wherein the exposed sidewalls of the upper portions of the plurality of lower electrodes are disposed between the two of the plurality of support layers vertically spaced apart from each other; and
etching the exposed sidewalls of the plurality of lower electrodes to increase a distance between the upper portions of the lower electrodes adjacent to each other after the removing one of the plurality of mold layers.

14. The method of claim 13, wherein the forming the stacked structure includes: forming an etch stop layer, a first mold layer of the plurality of mold layers, a first support layer of the plurality of support layers, a second mold layer of the plurality of mold layers, and a second support layer of the plurality of support layers sequentially stacked on the substrate;
patterning the etch stop layer, the first mold layer, the first support layer, the second mold layer, and the second support layer to form a plurality of openings spaced apart from each other and defined by the etch stop layer, the first mold layer, the first support layer, the second mold layer, and the second support layer, and
forming the lower electrodes in the plurality of openings,
the plurality of openings corresponding to the plurality of holes defined by the plurality of mold layers and support layers alternately stacked.

15. The method of claim 13, further comprising:
forming an ILD pattern on the substrate,
the ILD pattern including a plurality of holes that expose the substrate;
forming a plurality of contact plugs in the plurality of holes of the ILD pattern;
wherein the forming the stacked structure on the substrate includes,
forming the stacked structure on the ILD pattern, and
forming the lower electrodes on the plurality of contact plugs.

16. The method of claim 13, further comprising:
forming an upper-electrode hole in the stacked structure by,
patterning an upper one of the two support layers, in which the upper portions of the plurality of lower electrodes are between, before the exposing the sidewalls of the upper portions of the plurality of lower electrodes,
patterning a lower one of the two support layers, in which the upper portions of the plurality of lower electrodes are between, after the etching the exposed sidewalls of the plurality of lower electrodes, and
removing an other of the plurality of mold layers from below the lower one of the two support layers;
forming a capacitor dielectric layer covering surfaces of the plurality of lower electrodes, the capacitor dielectric layer defining voids between the plurality of electrodes; and
forming an upper electrode in the upper-electrode hole of the stacked structure and the voids defined by the capacitor dielectric layer.

17. The method of claim 13, further comprising:
connecting a controller to the semiconductor memory device formed by the method of claim 16.

18. The method of claim 1, wherein the removing the second mold layer occurs after the patterning the second support pattern,
the portions of the sidewalls of the lower electrodes exposed from the removing the second mold layer extend between an upper surface of the first support layer and a lower surface of the second support pattern, and
the second support pattern contacts the sidewalls of the lower electrodes in a location above the portions of the sidewalls of the lower electrodes exposed from the removing the second mold layer.

19. The method of claim 13, further comprising:
forming a support pattern by patterning a support layer, wherein
the stacked structure includes the support layer on the plurality of mold layers,
the exposing the sidewalls of the upper portions of the plurality of lower electrodes occurs after the forming the support pattern,
the support pattern contacts a side surface of the plurality of lower electrodes after the exposing the sidewalls of the upper portions of the plurality of lower electrodes.

20. The method of claim 1, wherein a lower distance between the lower portions of the lower electrodes adjacent to each other is greater than an upper distance between the upper portions of the lower electrodes adjacent to each other, before the etching the exposed sidewalls of the upper portions of the lower electrodes.

21. The method of claim 1, wherein
the removing the second mold layer includes removing all of the second mold layer, and
the second support pattern remains after the removing all of the second mold layer.

22. The method of claim 1, wherein the lower electrodes have a pillar shape.

23. The method of claim 13, further comprising:
patterning an uppermost one of the plurality of support layers,
wherein the removing the one of the plurality of mold layers includes removing all of the one of the plurality of mold layers, and the patterned uppermost one of the plurality of support layers remains after the removing all of the second mold layer.

24. The method of claim 13, wherein the lower electrodes have a pillar shape.

* * * * *